US012587153B2

(12) United States Patent
Chu et al.

(10) Patent No.: US 12,587,153 B2
(45) Date of Patent: Mar. 24, 2026

(54) INTEGRATING LIGHT SENSOR CIRCUIT

(71) Applicant: SENSORTEK TECHNOLOGY CORP., Hsinchu County (TW)

(72) Inventors: Hsing-Chien Chu, Hsinchu County (TW); Tsung-Han Wu, Hsinchu County (TW); Chi-Hsuan Sun, Hsinchu County (TW); Meng-Yong Lin, Hsinchu County (TW)

(73) Assignee: SENSORTEK TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 18/594,576

(22) Filed: Mar. 4, 2024

(65) Prior Publication Data

US 2025/0007474 A1 Jan. 2, 2025

Related U.S. Application Data

(60) Provisional application No. 63/449,656, filed on Mar. 3, 2023.

(51) Int. Cl.
*H03F 3/45* (2006.01)
*G01J 1/44* (2006.01)
*G01J 1/46* (2006.01)

(52) U.S. Cl.
CPC ............ *H03F 3/45475* (2013.01); *G01J 1/44* (2013.01); *G01J 1/46* (2013.01); *G01J 2001/446* (2013.01)

(58) Field of Classification Search
CPC ........ H03F 3/45475; H03F 2203/45514; G01J 1/46; G01J 2001/446; G01J 1/44; H04N 25/78; H04N 25/77
See application file for complete search history.

(56) References Cited

U.S. PATENT DOCUMENTS

| | | | |
|---|---|---|---|
| 8,847,169 B2 | 9/2014 | Yuan et al. | |
| 9,525,837 B1 * | 12/2016 | Eshel | G11C 27/024 |
| 10,620,299 B2 * | 4/2020 | Adut | H03F 3/50 |
| 11,874,166 B2 | 1/2024 | Chen | |
| 2017/0054926 A1 | 2/2017 | Kikuchi et al. | |
| 2019/0356877 A1 * | 11/2019 | Eshel | H04N 25/673 |
| 2020/0169675 A1 | 5/2020 | Stobie et al. | |
| 2021/0274118 A1 * | 9/2021 | Decaens | H04N 25/709 |

FOREIGN PATENT DOCUMENTS

| | | |
|---|---|---|
| TW | 201351884 A | 12/2013 |
| TW | I822381 B | 11/2023 |

OTHER PUBLICATIONS

Taiwan Intellectual Property Office Office Action Search Report on Oct. 16, 2024.

* cited by examiner

*Primary Examiner* — Georgia Y Epps
*Assistant Examiner* — Erin R Garber
(74) *Attorney, Agent, or Firm* — WPAT, PC

(57) ABSTRACT

The present application discloses a light sensor circuit comprising a first amplifier, a second amplifier and an active load. An integration circuit is formed by the operation of this light sensor circuit and connected to a photodiode. The cathode of the photodiode is controlled to maintain an identical or approximate voltage level with the anode of the photodiode, which significantly reduces the influence of the dark current from the photodiode. Consequently, when applied to an analog-to-digital conversion device, the light sensor circuit effectively maintains the performance and accuracy of the device. Additionally, this design significantly reduces circuit complexity and manufacturing costs.

8 Claims, 6 Drawing Sheets

INTEGRATING LIGHT SENSOR CIRCUIT

FIELD OF THE INVENTION

The present application relates to a light sensor circuit, in particular to a light sensor circuit adopting photodiodes.

BACKGROUND OF THE INVENTION

Light sensors implemented through light sensing technology are widely used in many applications. For example, ambient light sensors (ALS) may be used in electronic products to sense the intensity of ambient light for adjusting the brightness of a display screen. The light sensors may also be used to measure distance or location in a space. For example, mobile devices usually include a proximity sensor. Proximity sensors may be used to detect the distance between the user's face and the display screen of the electronic device. In this way, when the proximity sensor is close to the user's face, the electronic device may disable the display and touch functions.

Generally speaking, light sensors need to use an analog-to-digital converter (ADC) for converting the analog input signal generated by sensing light into a digital signal that can be processed by a digital circuit. There are many types of analog-to-digital converters, with different operating mechanisms, characteristics, and functions. However, the problems encountered by most analog-to-digital converters are the properties of junction capacitance and dark current, among others, that exist in photodiodes. For example, as shown in FIG. 1, the signal of a light sensor circuit is derived from the photocurrent generated by a photodiode PD. The photocurrent includes the sum of the dark current $I_{DARK}$ and the light current $I_{PD}$. In order to improve the linearity of the sensor, while making accurate sensor measurements, the dark current $I_{DARK}$ needs to be pre-calibrated in advance to prevent it from affecting the integrating unit 92 and reducing the accuracy of the sensing results.

The applicant's previous U.S. Pat. No. 11,874,166B2 has proposed a light sensor circuit in which the junction capacitance of a photodiode may be reduced to improve the charging and discharging speed and accuracy of the analog front-end circuit. However, the patent mainly focuses on the design of the integrating unit 9 as shown in FIG. 1 that operates under a reference voltage VCM, and therefore requires the use of a capacitor to maintain the cathode voltage of the photodiode.

The present application provides another light sensor circuit that solves problems such as junction capacitance or dark current of the photodiode by modifying the design of the integrating unit.

SUMMARY OF THE INVENTION

An objective of the present application is to provide a light sensor circuit configured to form an integrating unit and coupled to a photodiode. The cathode of the photodiode is controlled by the light sensor circuit to maintain identical or approximated voltage level with the anode thereof and thus making the apparent junction capacitance close to zero equivalently and further substantially reducing the influence of the dark current of the photodiode. Therefore, when applying the light sensor circuit to an analog-to-digital converter, the performance and accuracy of the analog-to-digital converter can be maintained effectively. In addition, according to the present application, no capacitor is required for controlling the cathode voltage of the photodiode. Consequently, the effect of suppressing the dark current and the apparent junction capacitance may be superior.

The present application relates to a light sensor circuit, which comprises a first amplifier, a second amplifier, and an active load. The first amplifier includes a first input, a second input, and a first output. The second amplifier includes a third input, a fourth input, and a second output. The third input and the fourth input are coupled to two terminals of a holding capacitor, respectively. The active load includes an integration output. The first output and the second output are coupled to the active load, respectively. In addition, a first switch is coupled between the first input and the second input; a second switch is coupled between the integration output and the fourth input; and a third switch is coupled between the third input and a reference voltage. The light sensor circuit is configured to form an integrating unit. The second input acts as an integration input. The integration output and the integration input are coupled to two terminals of an integration capacitor.

DETAILED DESCRIPTION OF THE INVENTION

In the specification and subsequent claims, certain words are used for representing specific devices. A person having ordinary skill in the art should know that hardware manufacturers might use different terms to refer to the same device. In the specification and subsequent claims, the differences in terminology are not used for distinguishing devices. Instead, the differences in functions are the guidelines for distinguishing. Throughout the specification and subsequent claims, the word "comprising" is an open language and should be interpreted as "comprising but not limited to". Besides, the word "couple" includes any direct and indirect electrical connection. Thereby, if the description is that a first device is coupled to a second device, it means that the first device is electrically connected to the second device directly, or the first device is connected electrically to the second device via other device or connecting means indirectly.

Figure 2:
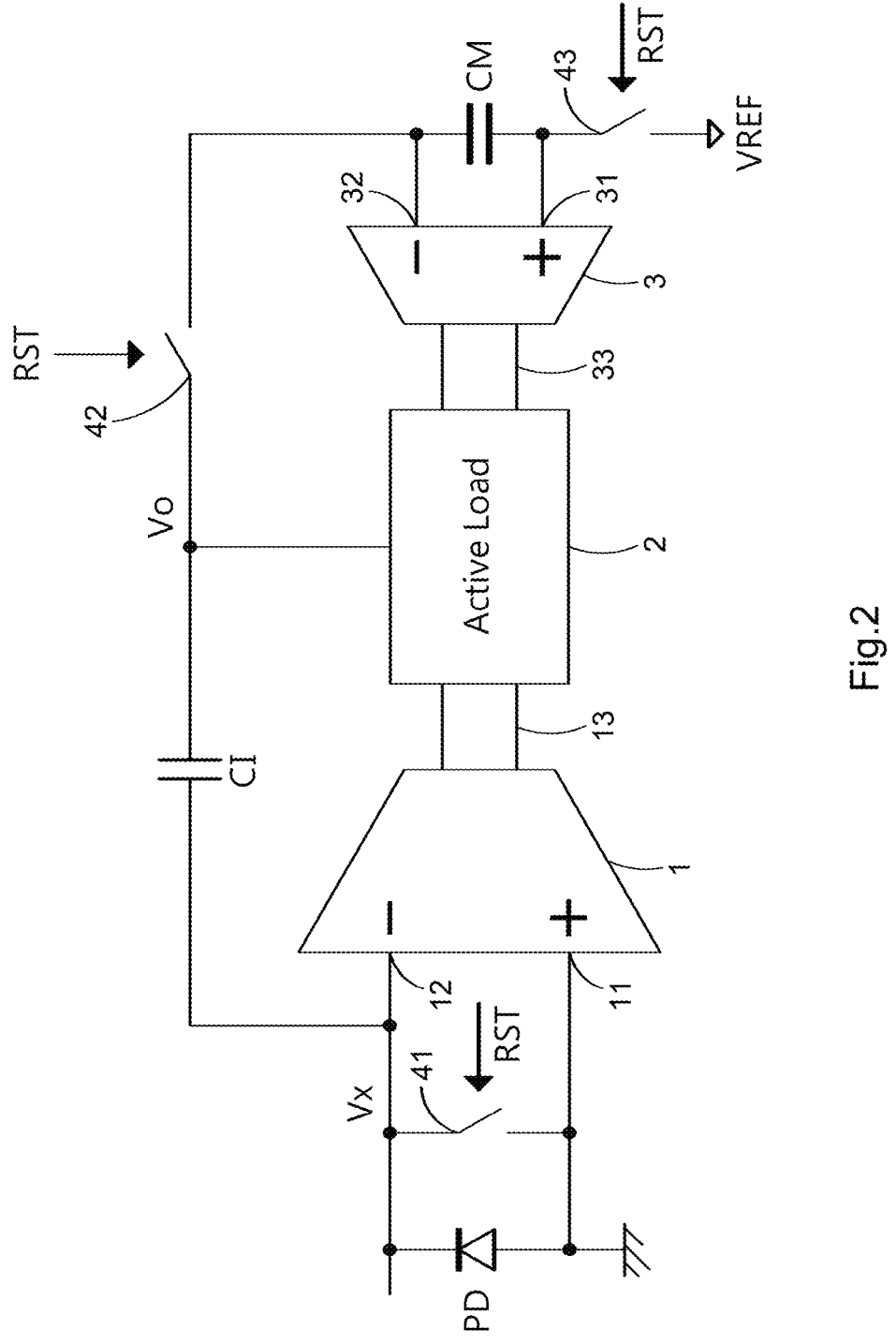
FIG. 2 shows an architecture diagram of the light sensor circuit according to an embodiment of the present application.

Please refer to FIG. 2, which shows an architecture diagram of the light sensor circuit according to an embodiment of the present application. As shown in the figure, the light sensor circuit according to present embodiment comprises a first amplifier 1, an active load 2, and a second amplifier 3. The first amplifier 1 and the second amplifier 3 are coupled to the active load 2, respectively.

The first amplifier 1 includes a first input 11, a second input 12, and a first output 13. The first input 11 may be coupled to the anode of a photodiode PD; the second input 12 may be coupled to the cathode of the photodiode PD. The first output 13 is coupled to the above-mentioned active load 2 so that the first amplifier 1 may output a current to the active load 2 via the first output 13. The first input 11 may be a non-inverting input; the second input 12 may be an inverting input. The anode of the photodiode PD is coupled to a common node of the system, which is represented by, but not limited to, the ground according to the present embodiment.

The light sensor circuit according to the present embodiment may be configured as an integrating unit for utilized as an integration circuit of the analog-to-digital converter described above. The integrating unit includes an integration input Vx, an integration output Vo, and an integration capacitor CI. The integration input Vx is the second input 12 of the first amplifier 1. The integration output Vo is the output of the active load 2.

To elaborate, the active load 2 is a device or a circuit with nonlinear resistor characteristics and stable current. An ideal active load may be represented by a constant current source. In general, to implement the active load 2, a current mirror will be adopted. The output of the current mirror may act as the integration output Vo. The integration output Vo and the integration input Vx are coupled to two terminals of the integration capacitor CI, respectively.

The second amplifier 3 includes a third input 31, a fourth input 32, and a second output 33. The third input 31 and the fourth input 32 are coupled to the two terminals of a holding capacitor CM, respectively. The second output 33 is coupled to the above-mentioned active load 2 so that the second amplifier 3 may output a current to the active load 2 via the second output 33. The third input 31 may be a non-inverting input; the fourth input 32 may be an inverting input.

The light sensor circuit according to the present embodiment of the present application further comprises a first switch 41, a second switch 42, and a third switch 43. The first switch 41 is coupled between the first input 11 and the second input 12 of the first amplifier 1. The second switch 42 is coupled between the integration output Vo and the fourth input 32 of the second amplifier 3. The third switch 43 is coupled between the third input 31 of the second amplifier 3 and a reference voltage REF. The reference voltage REF may be supplied by the analog-to-digital converter or other circuit components. The first switch 41, the second switch 42, and the third switch 43 may be controlled by the same control signal RST. This control signal RST may be the reset signal of the integration circuit since it is a necessary signal of the integration circuit. In a typical analog-to-digital converter, there is a timing control signal for controlling the integration circuit to execute an integration operation and a reset operation. Consequently, there is no need to set up another circuit to generate the control signal RST. Of course, if other considerations exist, another circuit may be adopted to adjust or generate one or multiple signals to control these switches. This design is still within the scope of the present application. Besides, these switches may be implemented using metal-oxide-semiconductor field-effect transistors (MOSFETs), bipolar junction transistors (BJTs), or other circuit switches.

Figure 3:
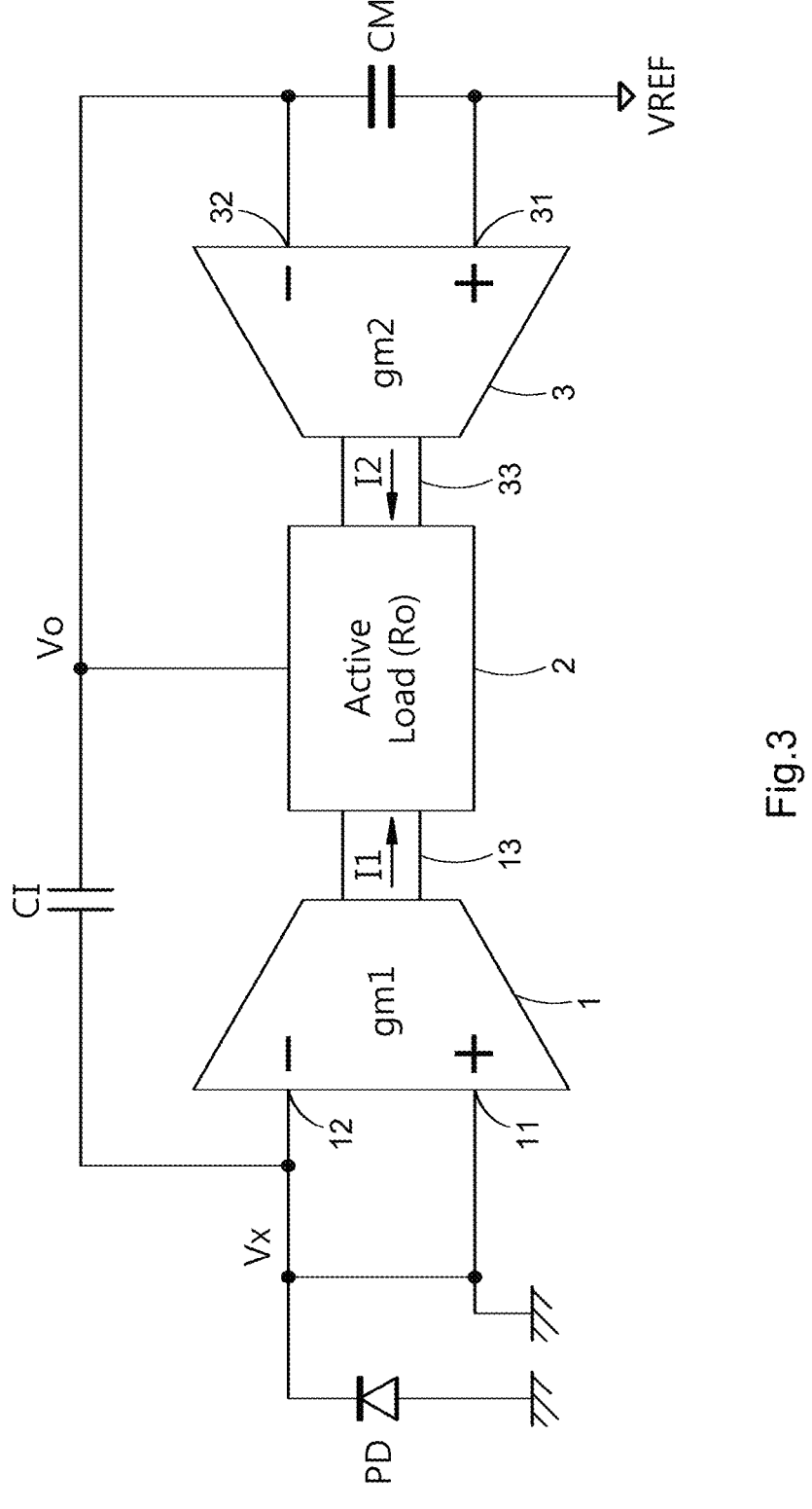
FIG. 3 shows the equivalent circuit of the reset operation of the light sensor circuit according to an embodiment of the present application.

In the following, the operation of the integration circuit formed by the light sensor circuit according to the present embodiment will be described. When the first switch 41, the second switch 42, and the third switch 43 are turned on by the control signal RST, the equivalent circuit of the light sensor circuit is shown in FIG. 3. Since the first switch 41 is turned on, the voltage of the integration input Vx will be identical to the voltage of the first input 11, namely, the anode voltage of the photodiode PD. In addition, since the second switch 42 and the third switch 43 are turned on, the third input 31 of the second amplifier 3 will receive the reference voltage REF. Furthermore, the fourth input 32 of the second amplifier 3 is coupled to the integration output Vo.

At this moment, the first amplifier 1 and the second amplifier 3 output currents to the active load 2 concurrently. For convenience, according to the present embodiment, the first amplifier 1 and the second amplifier 3 are operational transconductance amplifiers (OTAs), which are amplifiers converting the differential input voltage to the output current. Ideally, because the voltages of the first input 11 and the second input 12 are identical, the first amplifier 1 will output a fixed first current I1 to the active load 2. Limited by the active load 2, the first current I1 will continuously influence a second current I2 output by the second amplifier 3 to the active load 2. In other words, the second amplifier 3 will be in the negative-feedback configuration. Eventually, the second current I2 will drive the voltage difference between the third input 31 and the fourth input 32 to a predetermined value. Given the third input 31 is tied to the reference voltage REF, the voltage of the integration output Vo will be adjusted to the predetermined value. Meanwhile, the two terminals of the holding capacitor CM will be the reference voltage REF and the voltage of the integration output Vo, respectively.

If the equivalent resistance of the active load 2 is Ro, then the voltage of the integration output Vo may be expressed by:

$$Vo = VREF \times \left(1 - \frac{1}{1 + gm2 \times Ro}\right)$$

Note that the above equation is derived under ideal conditions, without considering the input offset voltage Vos of the amplifiers. If it is included and assuming that the second input 12 of the first amplifier 1 has a first offset voltage Vos1 and the fourth input 32 of the second amplifier 3 has a second offset voltage Vos2, the voltage of the integration output Vo may be expressed by:

$$Vo = VREF \times \left(1 - \frac{1}{1 + gm2 \times Ro}\right) + \frac{gm1}{gm2} \times Ro \times Vos1 + Vos2$$

where gm1 is a transconductance value of the first amplifier 1 and gm2 is a transconductance value of the second amplifier 3. It can be observed that if the gm2 is too small, the voltage of the integration output Vo will deviate from the reference voltage REF.

Figure 4:
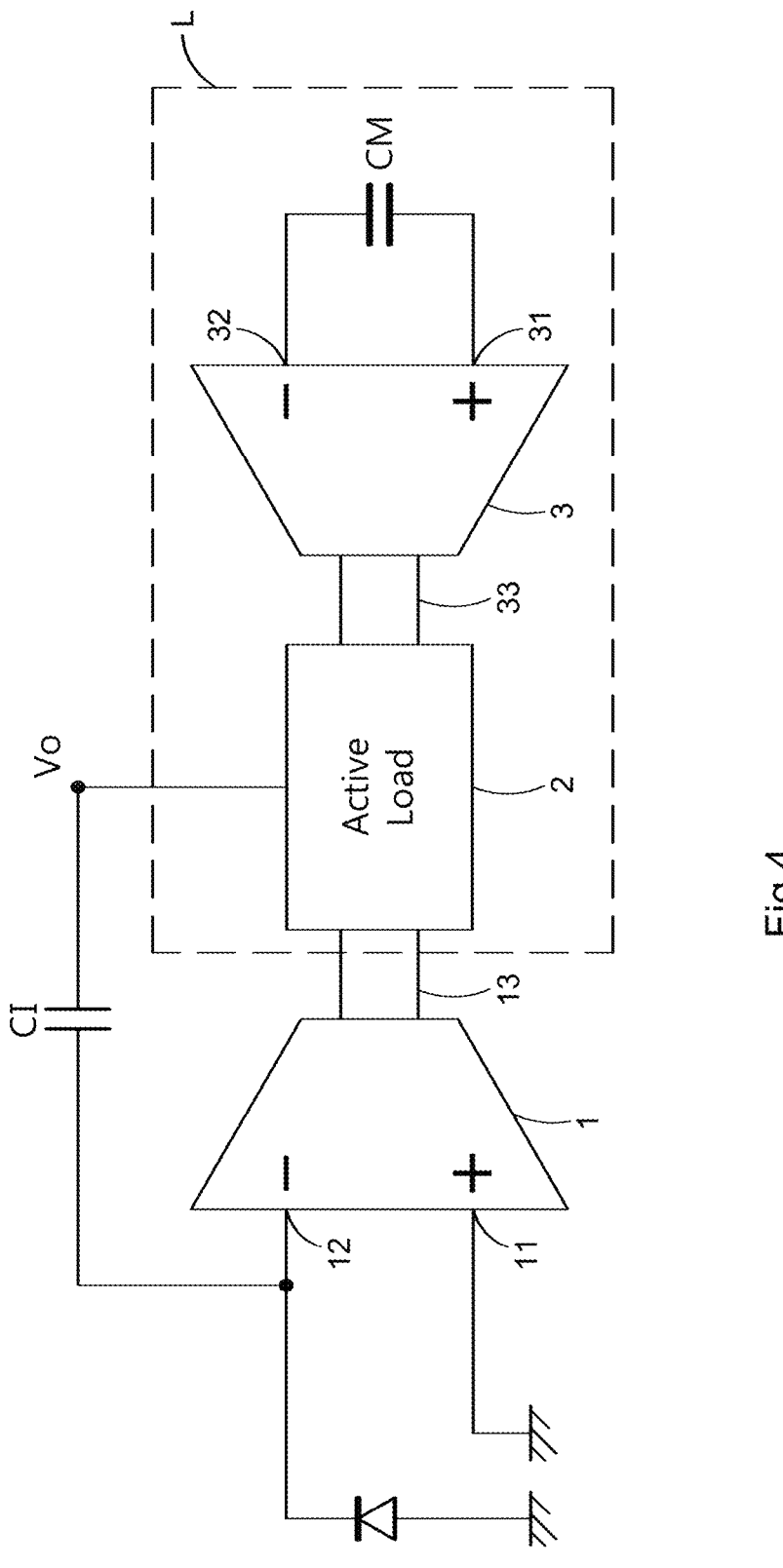
FIG. 4 shows the equivalent circuit of the integration operation of the light sensor circuit according to an embodiment of the present application.

After resetting the integrating unit, the first switch 41, the second switch 42, and the third switch 43 are turned off by the control signal RST to initiate the integration operation. The equivalent circuit of the light sensor circuit is shown in FIG. 4. Since the second switch 42 and the third switch 43 are turned off, the second amplifier 3 is floating at this moment. It relies on the holding capacitor CM to maintain the voltages of the third input 31 and the fourth input 32. Consequently, the active load 2 and the second amplifier 3 may be equivalently regarded as a single load L.

Figure 1:
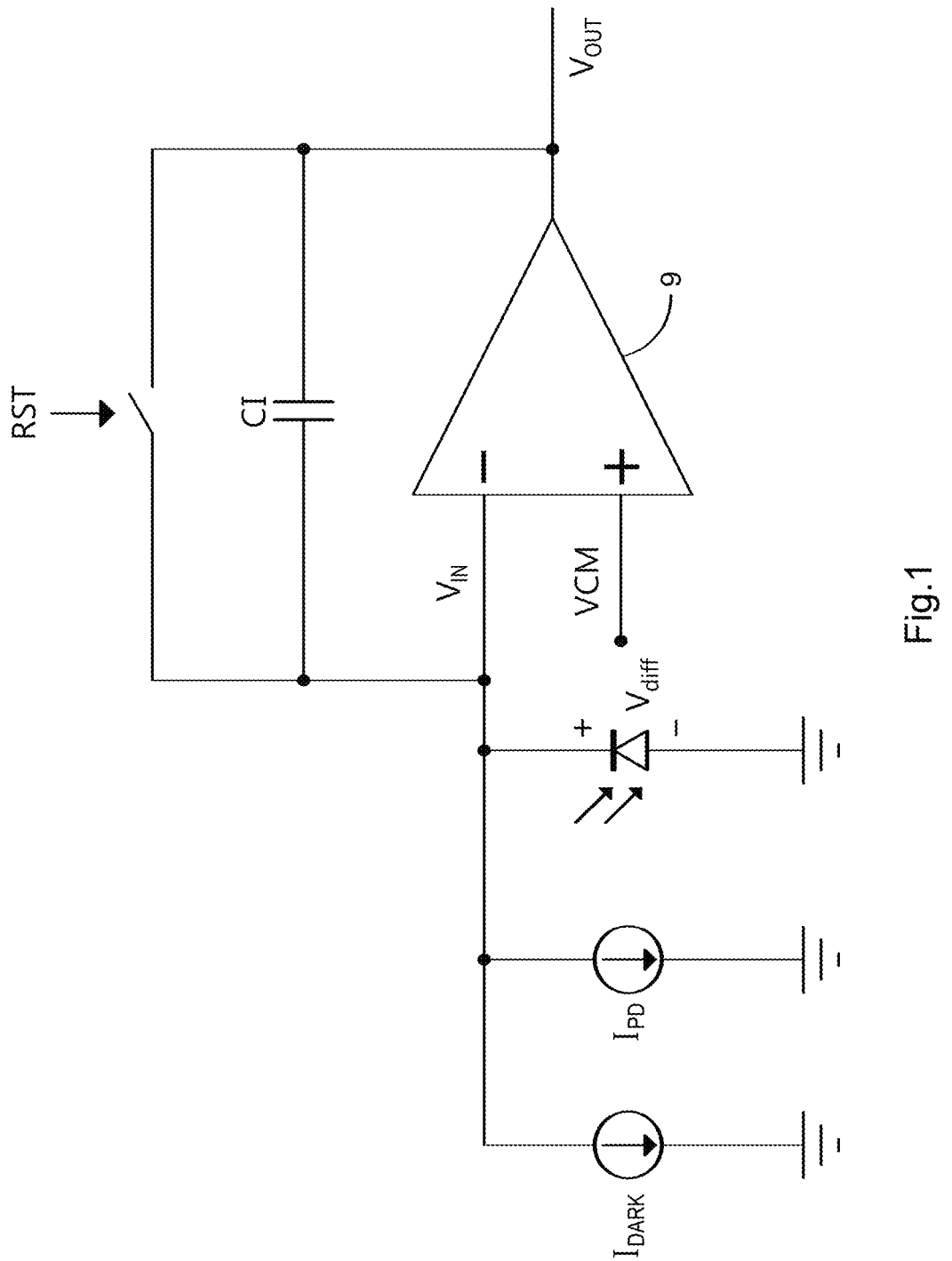
FIG. 1 shows a schematic diagram of a partial circuit of the analog-to-digital converter according to the prior art.

Furthermore, because the first switch 41 is turned off, the photocurrent generated by illuminating the photodiode PD may flow to the integration capacitor CI and the first amplifier 1 may initiate the integration operation. The principle and process of the integration operation are well known to a person having ordinary skill in the art. Hence, the details will not be described here. However, it is noteworthy that in practice, the initial voltage of the integration input Vx according to the present embodiment is the ground voltage, while the initial voltage of the integration output Vo is, as described above, the reference voltage REF. Accordingly, the present embodiment of the present application is different from the prior art (the integrating unit 9 shown in FIG. 1).

By using this improvement, the present application enables the voltage of the integration input Vx to be identical or approximated to the voltage (in this embodiment, the ground voltage) of the first input 11 of the first amplifier 1 in the initial stage of the reset operation and the integration operation. In other words, the voltage of the integration input Vx may be set to be identical or approximated to the anode voltage of the photodiode PD. Consequently, the photodiode PD may be maintained at or close to zero bias.

The dark current $I_{DARK}$ is the current of a photodiode without illumination and generated by the bias voltage. The current may be expressed by:

$$I_{DARK} = I_{CO} \times \left( e^{\frac{V}{\eta V_T}} - 1 \right)$$

where $I_{CO}$ is the reverse saturation current; $V_T$ (in volt) is equal to the temperature (in K) divided by 11600; V is the bias of the photodiode; and $\eta$ is the material coefficient of the photodiode. According to the above equation, if the bias of the photodiode is 0V, the dark current will not be influenced by the coefficient $V_T$.

According to the present embodiment, the anode and cathode of the photodiode PD are maintained at or close to zero bias. Consequently, two terminals of the photodiode PD will not be influenced by the transient floating voltage. In other words, the junction capacitance of the photodiode PD will not charge or discharge current. The light sensor circuit according to the present application may make the apparent junction capacitance of the photodiode PD approach zero. Accordingly, the influence of the dark current on the photodiode PD may be significantly reduced.

Moreover, it may be noticed that in the process of the integration operation as described above, the active load 2 and the second amplifier 3 may be regarded as a load L of the first amplifier 1. However, if the voltage across the holding capacitor CM fluctuates, this fluctuation will influence the voltage of the integration output Vo through the transconductance ratio between the first amplifier 1 and the second amplifier 3. Therefore, it is desirable to design the transconductance value gm2 of the second amplifier 3 not greater than (i.e., smaller than or equal to) the transconductance gm1 of the first amplifier 1. Summing up the above considerations, the transconductance ratio between the first amplifier 1 and the second amplifier 3 may be selected between 1:1 and 10:1, for example, gm1:gm2=2:1.

Figure 5:
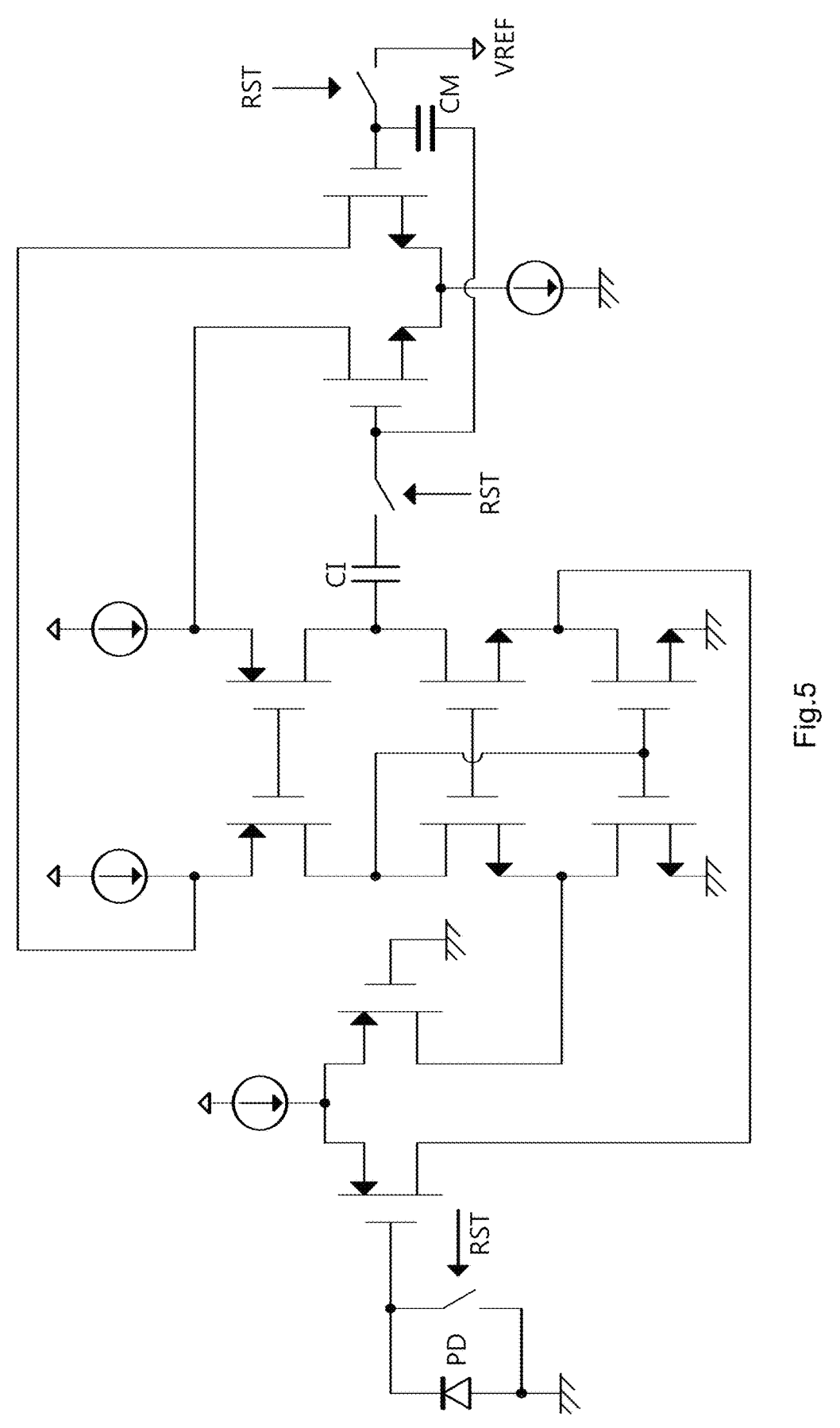
FIG. 5 shows an exemplary circuit of the light sensor circuit according to the present application.

The detailed architecture of the light sensor circuit according to the present application has been disclosed in the above embodiment. A person having ordinary skill in the art may implement the light sensor circuit accordingly. In addition, FIG. 5 provides an exemplary circuit of the light sensor circuit according to the present application. The example adopts a fundamental operational transconductance amplifier circuit and an active-load circuit to implement the light sensor circuit shown in FIG. 2. Since the operations of the circuit are identical to those illustrated in FIG. 3 and FIG. 4, the details will not be repeated.

Furthermore, in the previous embodiment, to illustrate the relationship between the amplifiers and the active load, operational transconductance amplifiers are adopted as the first amplifier 1 and the second amplifier 3. However, other types of amplifiers, such as operational amplifiers, may also be adopted as the first amplifier 1 and the second amplifier 3 to implement the light sensor circuit, provided that additional circuits are used to convert the output voltage of the amplifiers to the input current of the active load 2.

Figure 6:
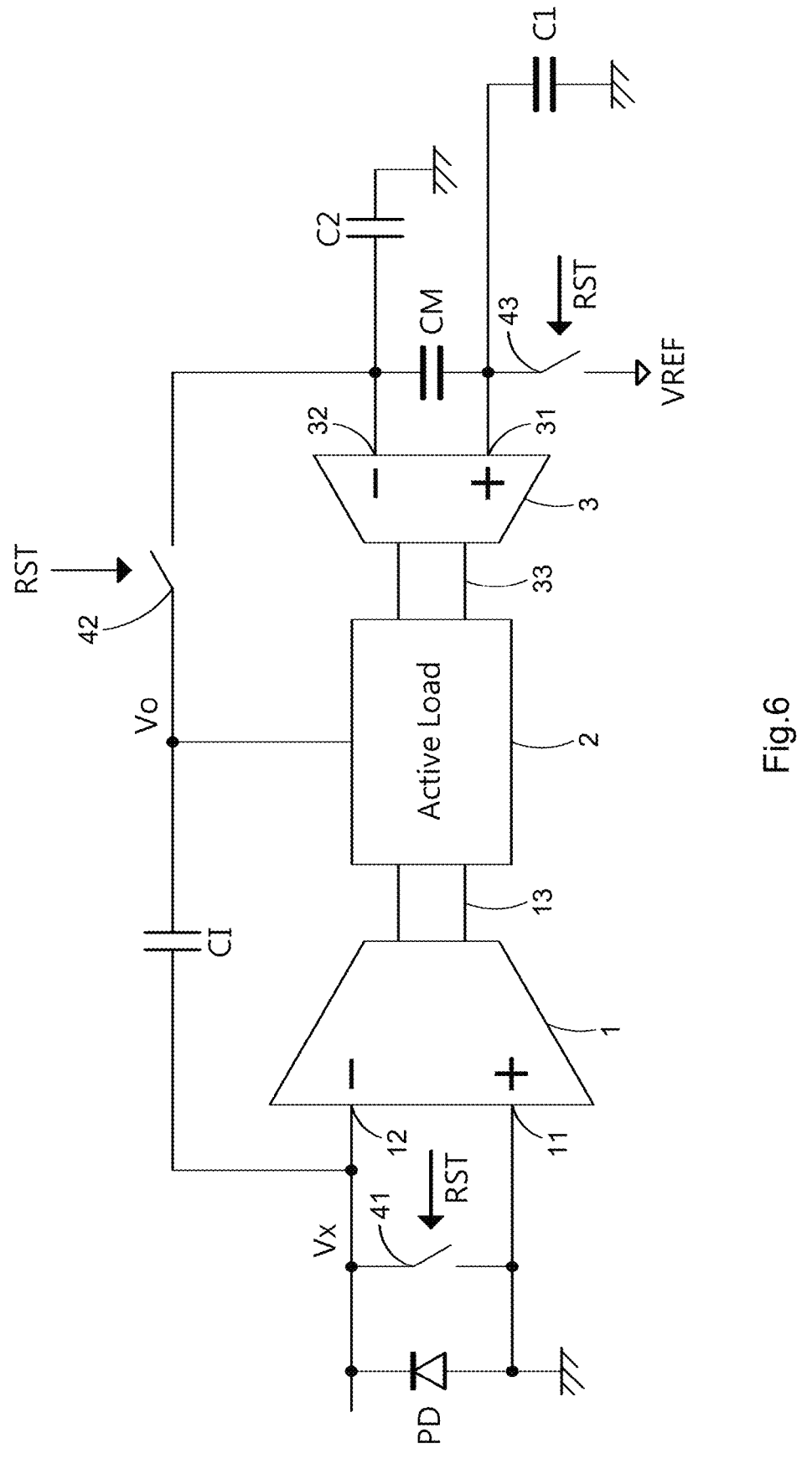
FIG. 6 shows an architecture diagram of the light sensor circuit according to another embodiment of the present application.

Please refer to FIG. 6, which shows an architecture diagram of the light sensor circuit according to another embodiment of the present application. The difference between the present embodiment and the previous one is that, in the present embodiment, the two terminals of the holding capacitor CM may be coupled to a first capacitor C1 and a second capacitor C2, respectively. The first capacitor C1 and the second capacitor C2 are further coupled to the common node of the system, namely, the ground in this embodiment. When the second switch 42 and the third switch 43 are turned off, the first capacitor C1 helps to hold the voltage of the third input 31 of the second amplifier 3, and the second capacitor C2 helps to hold the voltage of the fourth input 32 of the second amplifier 3. Alternatively, it is feasible to use only one of the first capacitor C1 and second capacitor C2, or to extend the capacitance of the holding capacitor CM to achieve the same effect.

To sum up, the present application provides a light sensor circuit. The cathode of the photodiode is controlled by the light sensor circuit to maintain an identical or approximate voltage level with its anode, thus making the apparent junction capacitance equivalently close to zero and further substantially reducing the influence of the dark current of the photodiode. Thereby, when applying the light sensor circuit to an analog-to-digital converter, the performance and accuracy of the analog-to-digital converter can be effectively maintained.

Moreover, according to the prior art as described above, a capacitor is required to hold the cathode voltage of the photodiode. The voltage across the capacitor is vulnerable to various factors. Contrarily, according to the embodiments of the present application, in the reset operation, switches are adopted to make the voltage of the integration input identical to the voltage of the first input of the first amplifier, namely, the anode voltage of the photodiode. No capacitor is required to indirectly control the cathode voltage of the photodiode. Accordingly, the effect of suppressing the dark current and the apparent junction capacitance may be superior.

The above illustrations are only preferred embodiments of the present application. Those equivalent changes or modifications made according to the claims of the present application fall within the scope of the present application.

The invention claimed is:

1. A light sensor circuit, comprising:
   a first amplifier, including a first input, a second input, and a first output;
   a second amplifier, including a third input, a fourth input, and a second output, and the third input and the fourth input coupled to the two terminals of a holding capacitor, respectively;

an active load, including an integration output, and the first output and the second output coupled to the active load, respectively;

a first switch, coupled between the first input and the second input;

a second switch, coupled between the integration output and the fourth input; and a third switch, coupled between the third input and a reference voltage;

wherein the light sensor circuit is operated to be formed as an integrating unit, the second input acts as an integration input, the integration output and the integration input are coupled to two terminals of an integration capacitor.

2. The light sensor circuit of claim 1, wherein switch conditions of the first switch, the second switch, and the third switch are controlled by a control signal.

3. The light sensor circuit of claim 2, wherein the first switch, the second switch, and the third switch are controlled by the control signal to switch on during a period of the integrating unit executing a reset operation; and the first switch, the second switch, and the third switch are controlled by the control signal to switch off during a period of the integrating unit executing an integration operation.

4. The light sensor circuit of claim 1, wherein the first input is a non-inverting input of the first amplifier, the second input is an inverting input of the first amplifier, the third input is a non-inverting input of the second amplifier, and the fourth input is an inverting input of the second amplifier.

5. The light sensor circuit of claim 1, wherein the first amplifier and the second amplifier are operational transconductance amplifiers.

6. The light sensor circuit of claim 5, wherein the first amplifier outputs a current to the active load via the first output, and the second amplifier outputs a current to the active load via the second output.

7. The light sensor circuit of claim 5, wherein a transconductance value of the second amplifier is not greater than a transconductance value of the first amplifier.

8. The light sensor circuit of claim 1, wherein the first input is configured for coupling to an anode of a photodiode; and the second input is configured for coupling to a cathode of the photodiode.

* * * * *